(12) United States Patent
Brantweiner et al.

(10) Patent No.: US 11,060,888 B2
(45) Date of Patent: Jul. 13, 2021

(54) METHOD FOR MEASURING AN ARMATURE POSITION AND COUPLING DEVICE USING SAID METHOD

(71) Applicant: MAGNA POWERTRAIN GMBH & CO KG, Lannach (AT)

(72) Inventors: Stefan Brantweiner, Stainz (AT); Reinhard Mick, Bad Vöslau (AT)

(73) Assignee: MAGNA POWERTRAIN GMBH & CO KG, Lannach (AT)

( * ) Notice: Subject to any disclaimer, the term of this patent is extended or adjusted under 35 U.S.C. 154(b) by 0 days.

(21) Appl. No.: 16/482,931

(22) PCT Filed: Feb. 1, 2018

(86) PCT No.: PCT/EP2018/052545
§ 371 (c)(1),
(2) Date: Aug. 1, 2019

(87) PCT Pub. No.: WO2018/141860
PCT Pub. Date: Aug. 9, 2018

(65) Prior Publication Data
US 2020/0011706 A1  Jan. 9, 2020

(30) Foreign Application Priority Data
Feb. 3, 2017  (DE) .................. 10 2017 201 758.9

(51) Int. Cl.
*G01B 7/14* (2006.01)
*G01D 5/20* (2006.01)
(Continued)

(52) U.S. Cl.
CPC ....... *G01D 5/2006* (2013.01); *G01R 27/2611* (2013.01); *H01F 7/08* (2013.01)

(58) Field of Classification Search
CPC .............. G01D 5/2006; G01D 5/2013; G01R 27/2611; G01R 15/183; G11B 5/5552
See application file for complete search history.

(56) References Cited

U.S. PATENT DOCUMENTS 5,481,187 A   1/1996  Marcott et al.
5,600,237 A * 2/1997  Nippert ................. F16D 48/064
                                                              324/207.16
(Continued)

FOREIGN PATENT DOCUMENTS

CN   87214828 U    8/1988
CN   1056765 A    12/1991
(Continued)

OTHER PUBLICATIONS

International Search Report and Written Opinion dated May 7, 2018 from corresponding International Patent Application No. PCT/EP2018/052545 with English translation of International Search Report.
(Continued)

*Primary Examiner* — Thang X Le
(74) *Attorney, Agent, or Firm* — Dickinson Wright PLLC

(57) ABSTRACT

The invention relates to a method for measuring the armature position of a solenoid having a coil with a movable armature, constructed as a bistable linear magnet and activated in a switched mode by means of pulse width modulation, wherein the depth of the current peaks at the solenoid is measured as a measure of the inductance and the position of the movable armature.

5 Claims, 3 Drawing Sheets

Figure 1:
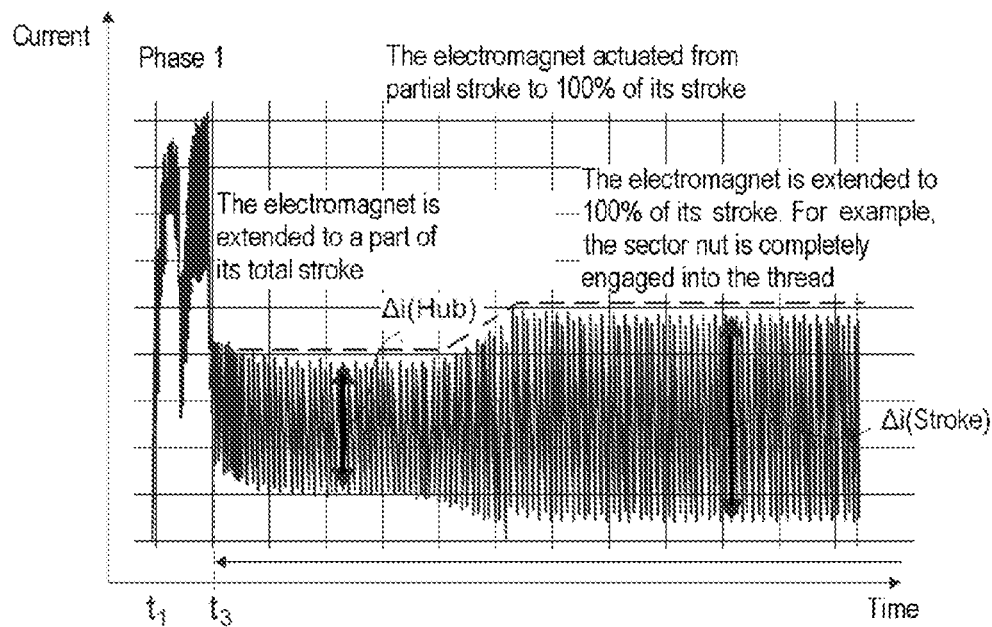

(51) Int. Cl.
*G01R 27/26* (2006.01)
*H01F 7/08* (2006.01)

(56) References Cited

U.S. PATENT DOCUMENTS

| | | | | |
|---|---|---|---|---|
| 5,861,746 | A * | 1/1999 | Ensten | B60T 8/36 |
| | | | | 324/207.16 |
| 6,541,961 | B1 * | 4/2003 | Max | G01B 7/02 |
| | | | | 324/207.12 |
| 8,008,909 | B2 * | 8/2011 | Feucht | G01D 5/202 |
| | | | | 324/207.12 |
| 2007/0005184 | A1 * | 1/2007 | Yamamoto | B65H 29/58 |
| | | | | 700/228 |
| 2007/0222461 | A1 * | 9/2007 | Miller | G01D 5/2006 |
| | | | | 324/656 |
| 2013/0199885 | A1 * | 8/2013 | Quehenberger | F16D 13/04 |
| | | | | 192/84.1 |
| 2014/0084024 | A1 * | 3/2014 | Benda | A47L 15/4454 |
| | | | | 222/113 |

FOREIGN PATENT DOCUMENTS

| | | |
|---|---|---|
| DE | 4443259 A1 | 6/1995 |
| DE | 19859281 A1 | 6/2000 |
| DE | 20114466 U1 | 1/2002 |
| DE | 102004056653 A1 | 6/2006 |
| DE | 102007016787 A1 | 10/2008 |
| DE | 102007048261 A1 | 4/2009 |
| DE | 102014118012 A1 | 6/2016 |
| WO | 2011098595 A1 | 8/2011 |
| WO | WO2011098595 A1 | 8/2011 |

OTHER PUBLICATIONS

Tremba, R., "bistabile Linearmagnete", Jul. 24, 2008; retrieved on-line URL:http://www.magnetbasics.de/hubmagnete/bistabil.htm, with computer generated English translation (1 page).

* cited by examiner

METHOD FOR MEASURING AN ARMATURE POSITION AND COUPLING DEVICE USING SAID METHOD

CROSS-REFERENCE TO RELATED APPLICATIONS

This application is a National Stage of International Application No. PCT/EP2018/052545, filed Feb. 1, 2018, which claims priority to DE102017201758.9 filed Feb. 3, 2017. The entire disclosures of each of the above applications are incorporated herein by reference.

FIELD OF THE INVENTION

The present invention describes a method for measuring an armature position of a solenoid and also a coupling device in a vehicle in which an actuator having a solenoid is used and is monitored by way of the method without using sensors.

BACKGROUND OF THE INVENTION

This section provides background information related to the present disclosure which is not necessarily prior art.

In the prior art, WO 2011098595A1 discloses a coupling arrangement for a powertrain of a motor vehicle, said coupling arrangement comprising a coupling that is arranged on a rotating shaft in order to selectively couple the rotating shaft to a drive element of the powertrain, and having an actuator in order to operate the coupling. The actuator is embodied for the purpose of selectively bringing an engagement portion into engagement with a threaded portion that rotates with the shaft in order to initiate a relative movement of the engagement portion and the threaded portion along the axis of the rotating shaft and as a consequence to operate the coupling in the axial direction. In this case, the position of the engagement means, a plunger, is determined by means of the movement of the armature of a solenoid. The position of the solenoid must be monitored, which is often performed using sensors. Sensor-free monitoring arrangements of armature positions are likewise disclosed in the prior art.

DE4443259A1 discloses by way of example a method for measuring the armature position, wherein the chronological curve of the coil current i(t) depends upon the armature position. The time constant that is to be determined or the integration time ty is a measure for the armature position. In both variants, a common factor is that the coil of the solenoid is used for the measurement. A separate sensor is not required. The two methods are based upon a combination of position measurement and control in a switched mode.

SUMMARY

This section provides a general summary of the disclosure, and is not a comprehensive disclosure of its full scope of all of its features.

The object of the invention is to propose a method having improved sensitivity. This method is to be usable when an actuator is used in a coupling device.

The object is achieved with a method for measuring the armature position of a solenoid having a coil with a movable armature, constructed as a bistable linear magnet and activated in a switched mode by means of pulse width modulation, wherein the depth of the current peaks at the solenoid is measured as a measure of the inductance and the position of the movable armature. Since the inductance of an electromagnet is dependent upon the operating point, in other words upon the stroke, it is possible by way of the variable inductance of the electromagnet to determine the stroke from the current curve of the pulse width modulation of the voltage. The stroke correlates to the current ripple, the peak-peak value of the current.

In the case of low selectively averaged current strengths it is therefore possible, without unwanted actuating of the solenoid, to determine the stroke position of said solenoid.

The method has the advantage that the solenoid is designed with stops on both sides.

Even when being influenced with positive or negative voltage pulses in the PWM and the resulting energization into the respective direction of the mechanical stop, it is not necessary to take into account unwanted movement with the result that arbitrarily long periods can be applied in order to increase the measuring accuracy.

The PWM activation of the voltage is reversed in its polarity in order to take measurements at the respective stops.

The sensitivity of the measurement is advantageously increased by a small PWM frequency over a short time with the result that highly sensitive measurements are also possible outside the stopping position. The method has the advantage that the switching interval between positive and negative PWM voltage is made sufficient over the range of the operating temperature of the solenoid.

The method has the advantage that the switching interval is increased by a temperature compensation by way of measuring the coil resistance through a measurement of the current. The sensitivity of the measuring method by way of the temperature can be increased with the aid of the permanent magnet of the bistable solenoid by polarization and overexcitation of the current.

It is advantageous to monitor an actuator in a coupling device by the method, said actuator operating for a coupling device of a powertrain, which moves and brings into engagement an engagement in relation to a threaded portion of a shaft.

It is advantageous that in the actuator unwanted actuating and blocking of the electromagnet by the adjusting mechanism of the coupling device is continuously monitored by a corresponding measurement of the current by way of an ECU.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

The invention is described below in an exemplary manner with reference to the attached drawing.

Figure 2:
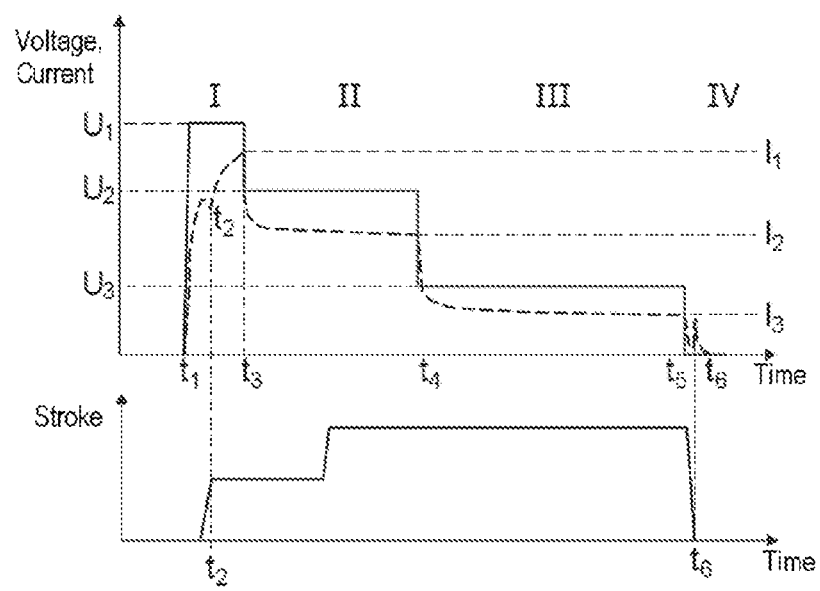
Figure 3:
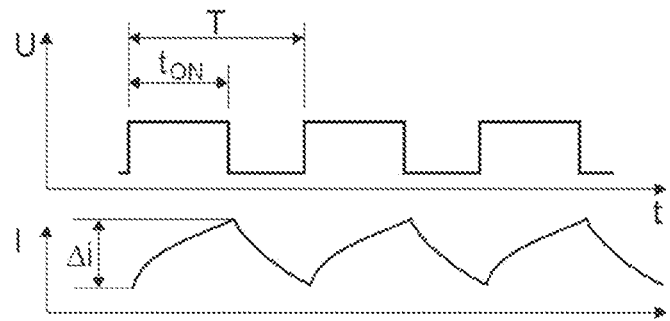
Figure 4:
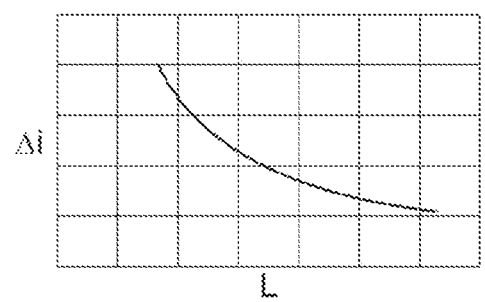
Figure 5:
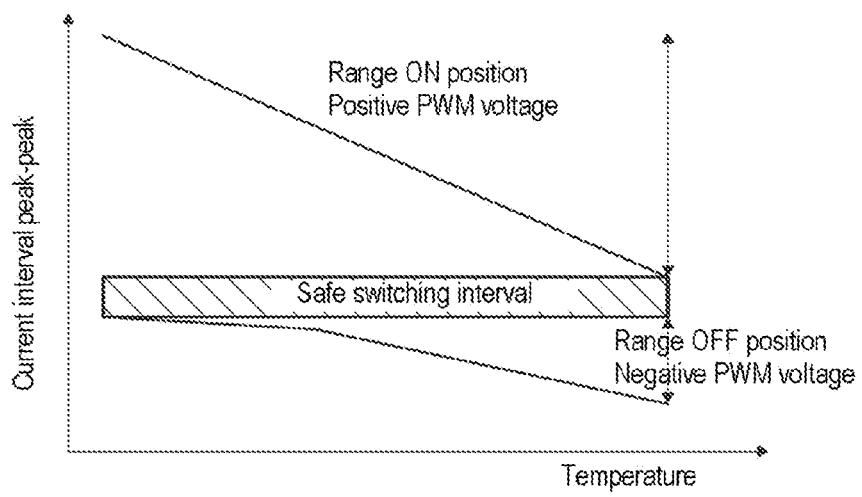
Figure 6:
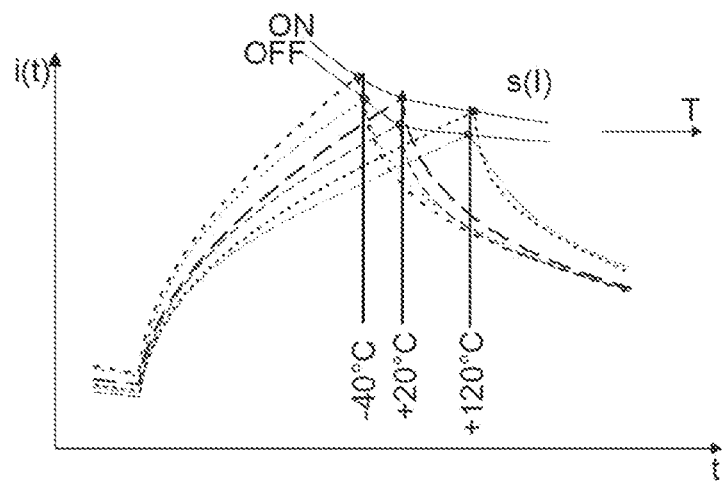
Figure 7:
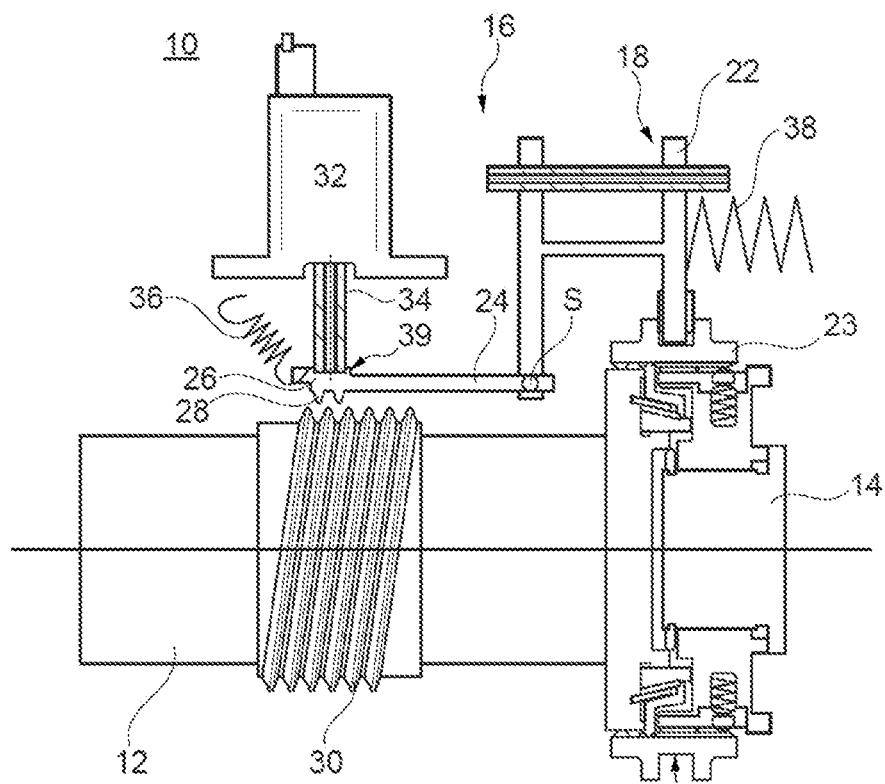

In the drawing:

FIG. 1 illustrates an unfiltered PWM current curve of a typical actuation of the electromagnet, FIG. 2 illustrates a typical voltage curve/current curve (RMS filtered) for activating the electromagnet, FIG. 3 illustrates a diagram of the specifying voltage PWM and also the resulting current consumption of the electromagnet, FIG. 4 illustrates a characteristic curve diagram of measured current ripple and inductance, FIG. 5 illustrates a safe switching interval, FIG. 6 illustrates an exemplary current ripple characteristic curve diagram over temperature and stroke, FIG. 7 illustrates an actuator in a coupling arrangement.

DETAILED DESCRIPTION

The following detailed description is merely exemplary in nature and is not intended to limit the described embodiments or the application and uses of the described embodiments. As used herein, the work "exemplary" or "illustrative" means "serving as an example, instance or illustration". Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the claims. Furthermore, there is no intention to be bound by any expressed or implied theory presented in the preceding technical field, background, brief summary or the following detailed description.

FIG. 7 illustrates an arrangement of a coupling device in which an actuator is used. In accordance with FIG. 7, a coupling arrangement 10 is arranged in a powertrain of a motor vehicle that is not illustrated in detail. A coupling 11, which can be by way of example a blocking synchronization, is used to selectively couple a rotating shaft 12 (by way of example an output shaft of a main transmission, a transfer case or an electric motor of a motor vehicle) and a pinion shaft 14 (by way of example of an axle shaft, a cardan shaft or an input element of an angular gearbox). The configuration that is illustrated in FIG. 7 corresponds to a completely engaged coupling 11, in other words a powertrain-effective, positive-locking coupling of the rotating shaft 12 and the pinion shaft 14, wherein the coupling 11 is pre-stressed into the engaged position in accordance with FIG. 7.

The coupling 11 is allocated an operating device 16, which comprises an adjusting element 18. A shifting fork 22 of the adjusting element 18 can be displaced parallel to the axis of rotation A of the rotating shaft 12 in order to displace a sleeve 23 and as a consequence to initiate an operation of the coupling 11. The shifting fork 22 can perform a movement in the axial direction as illustrated or however alternatively can be mounted in a rotatable manner about a point. A lever 24 is attached in an articulated manner to the shifting fork 22 in such a manner that said lever can pivot about a pivoting axis S that is arranged at a right-angle with respect to the axis of rotation A. An end portion of the lever 24 is embodied as an engagement portion in the form of a nut angle segment 28, which can be brought into engagement with a threaded portion 30 that is provided on the rotating shaft 12. The nut angle segment 28 on the lever 24 further forms a tappet 26 that is displaced when there is engagement between the threaded portion 30 and the nut angle segment 28 owing to the rotational movement of the rotating shaft 12 in the direction of the axis of rotation A. The displacement speed of the tappet 26 depends upon the incline and the gear number of the threaded portion 30 and also on the rotational speed of the rotating shaft 12.

An actuator 32 of the operating device 16, which is embodied here as an electrically activatable solenoid having a plunger 34 that may be displaced in a linear manner, ensures a selective engagement of the tappet 26 with the threaded portion 30. As is apparent in FIG. 7, the lever 24 is pre-stressed by means of a first resilient element 36 in a radial direction pointing away from the rotating shaft 12 and when the coupling 11 is not operated said lever lies against the tip of the plunger 34. Furthermore, a second resilient element 38 is provided, which pre-stresses the switching fork 22 in the axial direction in a direction that points away from the coupling 11. This pre-stressing direction corresponds in the case of the example illustrated here to the engaged direction. The resilient element 36 can be arranged in such a manner that it also entirely assumes the function of the second resilient element 38 in that said first resilient element is arranged at an angle with respect to the axis of rotation A. The proportion of the resilient force in the radial direction is responsible for lifting the lever 24, the axial proportion is responsible for moving the shifting fork 22.

If during the driving operation the pinion shaft 14 is to be disconnected as far as the driving operation is concerned from the rotating shaft 12, the solenoid 32 is activated, in other words energized, by means of a control device (not illustrated) with the result that the plunger 34 of said solenoid is moved against a pre-stressing arrangement (not illustrated) into an extended operating position.

Sensors are not used in order to monitor the movement of the plunger 34 by way of the solenoid, rather a measuring method is used. For this purpose, a bistable solenoid is used. Bistable solenoids are electromechanical magnets having a linear movement direction, wherein the armature stops in each end position. The effect of bistable solenoids differs in a small but particularly crucial detail from "normal" solenoids: when not energized the plunger core stops with considerable force in the two end positions.

In the case of bistable solenoids, the coil is divided more or less centrally with the result that a gap is provided. A permanent magnet is inserted into this gap. The armature itself is rotated both forward as well as to the rear in such a manner that in the respective end position said armature has a surface that lies planar with respect to the frame of the magnet. The magnetic field of the permanent magnet flows over this surface. The use of two separate coils is also possible, wherein these coils are activated separately of one another depending upon which direction the armature is to be moved in.

FIGS. 1 and 2 illustrate the curve of the voltage and of the current of a solenoid over the time once in an unfiltered illustration and also after the filtering procedure for smoothing purposes. In FIG. 1, the current curve is illustrated as the reaction to the pulse width signal of the voltage. The current fluctuates between a minimum and a maximum and in this case forms a current ripple from which the interval between minimum and maximum is named Δi. It is apparent that different intervals occur over the temporal curve.

In phase 1 that extends between t1-t3, the solenoid is rapidly actuated by an increased voltage $U_1$ by means of pulse width modulation by overexcitation using temporarily increased energization.

Phase 2 begins at t3 to t4 and describes the phase in which the solenoid displaces the armature, the shift phase. The energization of the first phase is reduced from the overexcitation to the required operating point, the required force. The armature is moved using a plunger that is connected to said armature and an operation for example of a lever 24 takes place. A coupling arrangement according to FIG. 7 is opened during this phase 2. The stroke of the armature and consequently the plunger can assume an intermediate position in this phase. A possible stroke intermediate position can be provided by the actuating opposing force or the respective switching position of the threaded portion of the coupling arrangement.

The voltage specification $U_2$ is constant over the shift phase.

In a third phase that extends from t4 to t5, the voltage and consequently the current is reduced to the required operating point for holding the electromagnet. The coupling arrangement according to FIG. 7 remains open during this phase 3. The current is reduced to 0 Amperes when a bistable electromagnet is used. The holding force is built up by a permanent magnet in the bistable solenoid.

In a fourth phase, the solenoid is disconnected after the time stamp t5. The bistable magnet remains attracted for as long as it is not energized until the PWM voltage is reversed in its polarity. A short negative current pulse for the duration of the switching time is sufficient in order to retract the bistable electromagnet back into its original position.

FIG. 3 illustrates schematically the pulse width method. The voltage is plotted over the time in the upper region. The switch on time $t_{on}$ per period T is apparent. The voltage is varied by varying this time $t_{on}$ and a lower or higher voltage value is set integrally. A further activating variant is provided by changing the period, in other words the frequency, of the activating signal.

The lower part of FIG. 3 illustrates how the current in the solenoid follows the signal of the pulse width modulation. In this case, it is to be noted that the current signal forms peaks and current ripples.

The interval between the peaks Δi depends upon the differential inductances L of the coils of the solenoid. The inductances of the coils change if the armature moves, consequently the air gap increases or decreases.

In this case, the differential inductances L follows the following relationship:

$$L = -R \cdot \frac{t_{on}}{\ln(1 - \Delta i \cdot R / U_{DC})}$$

Δi: Current ripple peak-peak
$U_{DC}$: Supply voltage PWM
$t_{on}$: On-time PWM
R: Resistance of the solenoid The differential inductances L can be determined by way of a measurement of the current ripple, as is illustrated in FIG. 4. A characteristic curve diagram is obtained in which the curve of the inductances and consequently of the armature stroke is determined for an individual solenoid.

In order to determine the activation for a specific solenoid, it is necessary to further determine a characteristic curve diagram. The characteristic curve diagram of Δi over stroke position can be sufficiently precisely recorded by way of a force stroke measuring machine in the case of simultaneous ECU current activation with little outlay.

In order to provide a robust system having a high sensitivity, it is advantageous if small stroke changes oppose large changes in the current ripple Δi.

The characteristic curve diagram of inductance over stroke can be set in this case in addition by the design of the electromagnet.

A correct engagement (stroke over time) can be monitored by way of corresponding current ripple-tolerance bands.

The measuring system in an ECU samples the current with a resolution of 12 bits. In order to be able to make reliable statements regarding the position of the armature by way of the measurement of the current, a precise as possible relative precision is required.

The sampling rate in this case cannot deviate from the PWM frequency. In order to increase the sensitivity, an effect for the measuring method is achieved by way of reversing the polarity of the voltage pulses during the bipolar activation. Measurements can be taken in the two end positions by reversing the polarity of the PWM voltage without risking unwanted actuations of the solenoid.

A lower average current is applied at the solenoid by temporarily selecting a smaller PWM frequency during the shifting phase. As a consequence, the current pulse can be extended and therefore more measuring values can be obtained. The short change of frequency in this case must be selected in such a manner that the solenoid does not perform an unwanted lifting movement.

The increase in current that is hardly limited in the end positions increases the relative resolution of the measurement of the current in the case of a constant absolute measuring resolution. This permitted increase in current is rendered possible by the winding and the design of the bistable magnet. Even in the case of being energized into the respective direction of the mechanical stop, it is not necessary to take into account unwanted movement with the result that arbitrarily long periods can be applied in order to increase the measuring accuracy.

The measuring method must also be usable over a large temperature range. When the actuator is used on a coupling device in the vehicle, a range of −40° C. to +125° C. must be covered without problems arising with the switching procedure of the bistable solenoid.

The switching procedure between the On and OFF state of the solenoid must be performed with a safe switching interval in the current strength.

It is possible by way of measuring the coil resistance to compensate for the influence of the temperature on the switching interval. It is also possible by means of determining an optimal coil resistance of the solenoid to find an optimized selection for implementing the method. Both the coil resistance as well as the inductance change by way of temperature.

In the case of a bistable magnet, the inductance is also influenced by way of the permanent magnet, the characteristics of said permanent magnet also being temperature-dependent.

Typically, the remanence reduces with a higher temperature.

If the sensitivity is preset by a large influence of the stroke on the current ripple, it is no longer necessary to compensate the temperature-dependent current ripple since the switching interval between the ON/OFF position is large enough over the temperature range.

This is illustrated in FIG. 5. At the end of the high temperature there is still a sufficient remaining switching interval between the polarities of the voltage by the large interval of the current ripple over the entire temperature range.

The difference between the curves occurs as a result of changes of the inductance with the stroke that is to be measured.

In other words, On/Off have a fundamentally different level of inductance, the current ripple. This effect is further superimposed with the effects of the temperature or polarity of the current activation.

FIG. 6 illustrates the curve of the current ripple over the time respectively for the On/Off state at different temperatures.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A method for measuring an armature position of a solenoid having a coil with a movable armature, constructed as a bistable linear magnet and activated in a switched mode by a signal of pulse width modulation (PWM), the method comprising:

measuring the depth of current peaks at the solenoid as a measure of the inductance of the coil with respect to a movement of the armature position;

wherein the PWM activation is reversed in its polarity;

wherein the switching interval between positive and negative PWM voltage is made sufficient over the range of the operating temperature of the solenoid;

wherein the switching interval is increased by a temperature compensation by way of measuring the coil resistance through a measurement of the current.

2. The method according to claim 1, wherein the solenoid includes stops on both sides.

3. The method according to claim 1, wherein a sensitivity of the measurement is increased by a small PWM frequency over a short time.

4. A coupling device of a powertrain wherein an operating device has an actuator, which moves and brings into engagement a nut segment in relation to a threaded portion of a shaft, wherein the actuator has a solenoid that is monitored by the method according to claim 1.

5. The coupling device according to claim 4, wherein unwanted actuating and blocking of the electromagnet by the adjusting mechanism of the coupling device can be continuously monitored by a corresponding measurement of the current by way of an ECU.

* * * * *